(12) United States Patent
Peidous et al.

(10) Patent No.: US 7,605,045 B2
(45) Date of Patent: Oct. 20, 2009

(54) FIELD EFFECT TRANSISTORS AND METHODS FOR FABRICATING THE SAME

(75) Inventors: Igor Peidous, Fishkill, NY (US); Patrick Press, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 109 days.

(21) Appl. No.: 11/457,300

(22) Filed: Jul. 13, 2006

(65) Prior Publication Data

US 2008/0014704 A1 Jan. 17, 2008

(51) Int. Cl.
*H01L 21/336* (2006.01)

(52) U.S. Cl. .................. 438/305; 257/E21.622

(58) Field of Classification Search .......... 438/305; 257/E21.622, E21.636, E29.126
See application file for complete search history.

(56) References Cited

U.S. PATENT DOCUMENTS

| | | | | |
|---|---|---|---|---|
| 7,176,522 B2* | 2/2007 | Cheng et al. | ................. | 257/338 |
| 7,179,745 B1* | 2/2007 | Waite et al. | ................. | 438/694 |
| 2005/0026379 A1* | 2/2005 | Kammler et al. | ............ | 438/303 |
| 2005/0275042 A1* | 12/2005 | Hwang et al. | ................ | 257/401 |
| 2005/0287752 A1* | 12/2005 | Nouri et al. | .................. | 438/303 |
| 2006/0124974 A1* | 6/2006 | Cabral et al. | ................. | 257/274 |
| 2006/0199321 A1* | 9/2006 | Lo et al. | ...................... | 438/197 |
| 2006/0220153 A1* | 10/2006 | Murthy et al. | .............. | 257/408 |
| 2006/0263961 A1* | 11/2006 | Kittl et al. | ................... | 438/199 |
| 2007/0015334 A1* | 1/2007 | Kittl et al. | ................... | 438/303 |
| 2007/0023848 A1* | 2/2007 | Steiner et al. | ............... | 257/410 |
| 2007/0023849 A1* | 2/2007 | Yu et al. | ..................... | 257/412 |
| 2007/0029620 A1* | 2/2007 | Nowak | ....................... | 257/369 |
| 2007/0090417 A1* | 4/2007 | Kudo | ......................... | 257/288 |
| 2007/0128786 A1* | 6/2007 | Cheng et al. | ................. | 438/199 |
| 2007/0128820 A1* | 6/2007 | Majumdar et al. | .......... | 438/369 |
| 2007/0210301 A1* | 9/2007 | Han | .............................. | 257/18 |
| 2007/0241396 A1* | 10/2007 | Yasutake | .................... | 257/336 |
| 2007/0246752 A1* | 10/2007 | Cheng et al. | ................ | 257/288 |
| 2007/0262399 A1* | 11/2007 | Dewey et al. | ............... | 257/410 |
| 2008/0009110 A1* | 1/2008 | Chang et al. | ................ | 438/197 |

* cited by examiner

*Primary Examiner*—Thao P. Le
(74) *Attorney, Agent, or Firm*—Ingrassia, Fisher & Lorenz, P.C.

(57) ABSTRACT

Field effect transistors and methods for fabricating field effect transistors are provided. A method, in accordance with an exemplary embodiment of the invention, comprises forming a polycrystalline silicon gate electrode overlying a silicon substrate. The gate electrode has two parallel sidewalls. Two sidewall spacers are fabricated overlying the silicon substrate. Each of the two sidewall spacers has a sidewall that is adjacent to one of the two parallel sidewalls of the gate electrode. A portion of the gate electrode between the two sidewall spacers is removed.

17 Claims, 9 Drawing Sheets

US 7,605,045 B2

FIELD EFFECT TRANSISTORS AND METHODS FOR FABRICATING THE SAME

FIELD OF THE INVENTION

The present invention generally relates to field effect transistors and to methods for their fabrication, and more particularly relates to field effect transistors that experience reduced parasitic capacitance and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A FET, such as FET 10 illustrated in FIG. 1, includes a gate electrode 12 as a control electrode overlying a gate insulator 32 that is disposed on a semiconductor substrate 14. Spaced-apart source and drain electrodes 16 between which a current can flow also are disposed in the substrate. The source and drain electrodes 16 typically are formed using two steps. First, conductivity-determining ions are implanted into the substrate 14 using the gate electrode 12 as an ion implantation mask to form shallow impurity doped regions or source and drain extensions. Same or different conductivity-determining ions then are implanted into the substrate 14 at a higher energy using the gate electrode 12 and sidewall spacers 28 disposed adjacent to sidewalls 34 of the gate electrode as an ion implantation mask. Metal silicide 20 is formed on the gate electrode 12 and the source and drain electrodes 16 to make electrical contact thereto. An interlayer dielectric (ILD) 22 is typically deposited over the gate electrode and source and drain electrodes and a conductive contact 24 is formed within the ILD to contact the source and/or drain electrodes. A control voltage applied to the gate electrode controls the flow of current through a channel 18 in the substrate between the source and drain electrodes 16.

The gate electrode 12 is formed of a conductive material, typically polycrystalline silicon. The height, indicated by double-headed arrow 26, of the gate electrode 12 is determined by several factors. The gate electrode 12 should have a height 26 sufficiently large to prevent conductivity-determining ions from penetrating through the gate electrode into the channel 18 of the substrate during formation of the source and drain regions. The gate electrode also should have a height 26 sufficiently large so that sidewall spacers 28 are formed consistent in width and wide enough to separate the gate electrode 12 from the metal silicide contacts 20 on the source and drain regions.

Another factor determining the height of the gate electrode is the desired width of the gate electrode. MOS transistors have now been aggressively reduced to the point at which the gate electrode of the transistor is less than or equal to 40 nanometers (nm) in width. One of the limiting factors in the continued shrinking of integrated semiconductor devices is the difficulty in obtaining high aspect ratio gate electrode definitions, that is, very high and very narrow gate electrodes. To form such structures, relatively thin layers of resist are used during photolithography. However, during patterning of the gate electrode using reactive ion etching (RIE), the thin resist can be etched away, resulting in etching of the gate electrode. Accordingly, the gate electrode should have a height 26 small enough that formation of the gate electrode using current photolithography technologies is possible. Thus, present day technology generally requires a gate electrode having a thickness in the range of about 80 to about 150 nm.

Another challenge in the fabrication of FETs resulting from the gate electrode geometry is the creation of parasitic capacitance, shown for the purposes of illustration as dashed lines 30, between the gate electrode 12 and the proximate contact 24. The parasitic capacitance 30 is proportional to the area of the interfacing structures, that is, the gate electrode 12 and the contact 24. Accordingly, the greater the height 26 of the gate electrode, the greater the parasitic capacitance.

A major challenge relating to the gate electrode geometry is the localized penetration of silicide 20 from the top of the gate electrode 12 towards the gate oxide 32, as illustrated in FIG. 2. This phenomenon, referred to as "silicide roughness", is thought to be associated with portions of the polycrystalline silicon sidewalls 34 of the gate electrode, which become exposed due to non-uniform sidewall spacer 28 recess during various etch and cleaning processes. The roughness results in non-reproducible resistivity characteristics from device to device. In addition, if the silicide penetration extends the entire sidewall 34 of the gate electrode 12 to the gate insulator 32, catastrophic device failure will result from a short circuit between the gate electrode 12 to the source and drain electrodes.

Accordingly, it is desirable to provide a field effect transistor that experiences reduced parasitic capacitance during operation. In addition, it is desirable to provide a field effect transistor that does not suffer from silicide roughness. It also is desirable to provide methods for forming such field effect transistors. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for fabricating a field effect transistor is provided. The method comprises forming a polycrystalline silicon gate electrode overlying a silicon substrate, wherein the gate electrode has two parallel sidewalls. Two sidewall spacers are fabricated overlying the silicon substrate. Each of the two sidewall spacers has a sidewall that is adjacent to one of the two parallel sidewalls of the gate electrode. A portion of the gate electrode between the two sidewall spacers is removed.

In accordance with another exemplary embodiment of the present invention, a method for fabricating a field effect transistor is provided. The method comprises depositing and patterning a layer of polycrystalline silicon overlying a silicon substrate to form a gate electrode. The gate electrode has sidewalls and defines a channel in the silicon substrate underlying the gate electrode. First ions of a conductivity-determining impurity are implanted into the silicon substrate using the gate electrode as an implantation mask to form spaced-apart impurity-doped extensions. A layer of spacer-forming material is deposited overlying the gate electrode and is anisotropically etched to form sidewall spacers disposed adjacent to the sidewalls of the gate electrode. Second ions of a conductivity-determining impurity are implanted into the silicon substrate using the gate electrode and the sidewall spacers as an implantation mask to form spaced-apart impurity-doped regions. A portion of the gate electrode from between the sidewall spacers is removed and metal silicide is formed on the gate electrode and on the spaced-apart impurity doped regions.

In accordance with a further exemplary embodiment of the present invention, a field effect transistor is provided. The field effect transistor comprises a gate electrode disposed overlying a surface of a silicon substrate. The gate electrode has a first sidewall and a second sidewall. A metal silicide layer is disposed on the gate electrode. The gate electrode and the metal silicide layer together have a first height as measured from the surface of the silicon substrate. A first sidewall spacer has a sidewall that is disposed parallel and adjacent to the first sidewall of the gate electrode. A second sidewall spacer has a sidewall that is disposed parallel and adjacent to the second sidewall of the gate electrode. The sidewalls of the first and second sidewall spacers have a second height, as measured from the surface of the silicon substrate, that is greater than the first height.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 3:
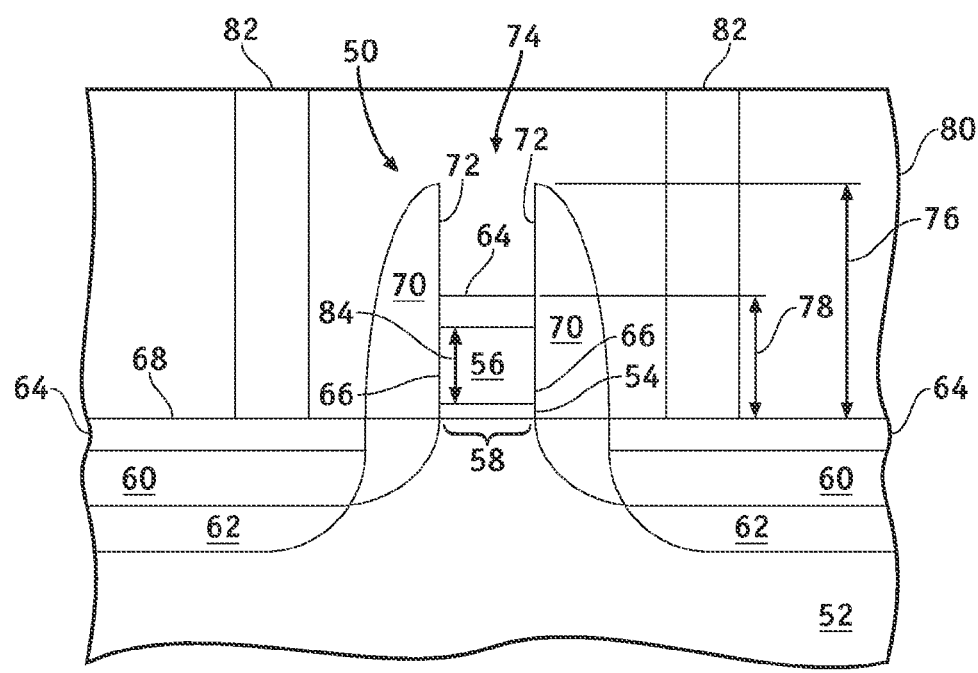
FIG. 3 is a cross-sectional view of a field effect transistor in accordance with an exemplary embodiment of the present invention.

FIG. 3 schematically illustrates, in cross section, a field effect transistor (FET) 50 in accordance with an exemplary embodiment of the invention. FET 50 includes a silicon substrate 52 having a gate insulator 54 formed at the substrate surface. A gate electrode 56 overlies the gate insulator. The gate electrode defines the location of a transistor channel 58 at the substrate surface and underlying the gate electrode. Shallow region of conductivity-determining ions are implanted into the silicon substrate in close proximity to the edges of the transistor channel 58 to form source and drain extensions 60. Deeper regions of conductivity-determining ions are implanted into the silicon substrate at a location spaced further apart from the channel 58 to form source and drain regions 62. Metal silicide 64 is disposed on the gate electrode 56 and on the source and drain regions 62 to permit electrical communication thereto.

As illustrated in FIG. 3, gate electrode 56 has two parallel sidewalls 66 that extend substantially perpendicular to a surface 68 of the substrate 52. A sidewall spacer 70 is disposed adjacent to each of the sidewalls 66 of the gate electrode 56. Each of the sidewall spacers 70 has a sidewall 72 that extends substantially perpendicular to surface 68 of the substrate 52. The sidewalls 72 of sidewall spacers 70 are parallel and form a space 74 disposed therebetween. Gate insulator 54, gate electrode 56, and metal silicide 64 are disposed between sidewalls 72 only within a portion of space 74. In other words, the sidewalls 72 of spacers 70 have a height measured from the surface 68 of silicon substrate 52, and indicated by double-headed arrow 76, that is greater than a height measured from the surface 68 of silicon substrate 52, and indicated by double-headed arrow 78, of gate insulator 54, gate electrode 56, and metal silicide 64. In a preferred embodiment of the invention, the gate electrode has a height, indicated by double headed arrow 84, of about 10 to about 40 nm. In a more preferred embodiment of the invention, the gate electrode has a height of about 20 to about 30 nm. An ILD layer 80 is disposed overlying FET 50 and separates FET 50 from conductive contacts 82 that extend therethrough to electrically communicate with the source and drain regions via metal silicide 64.

Figure 1:
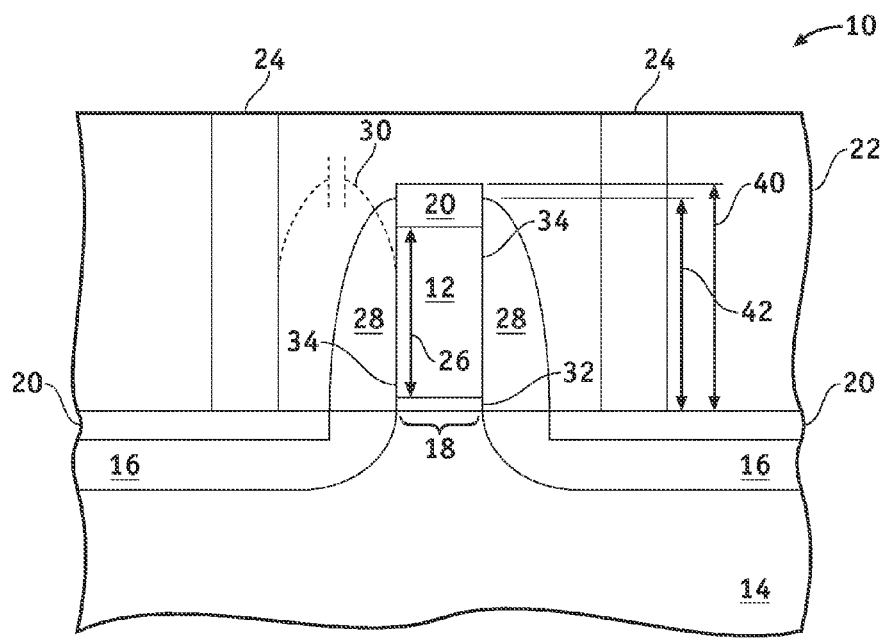
FIG. 1 is a cross-sectional view of a prior art field effect transistor with parasitic capacitance.
Figure 2:
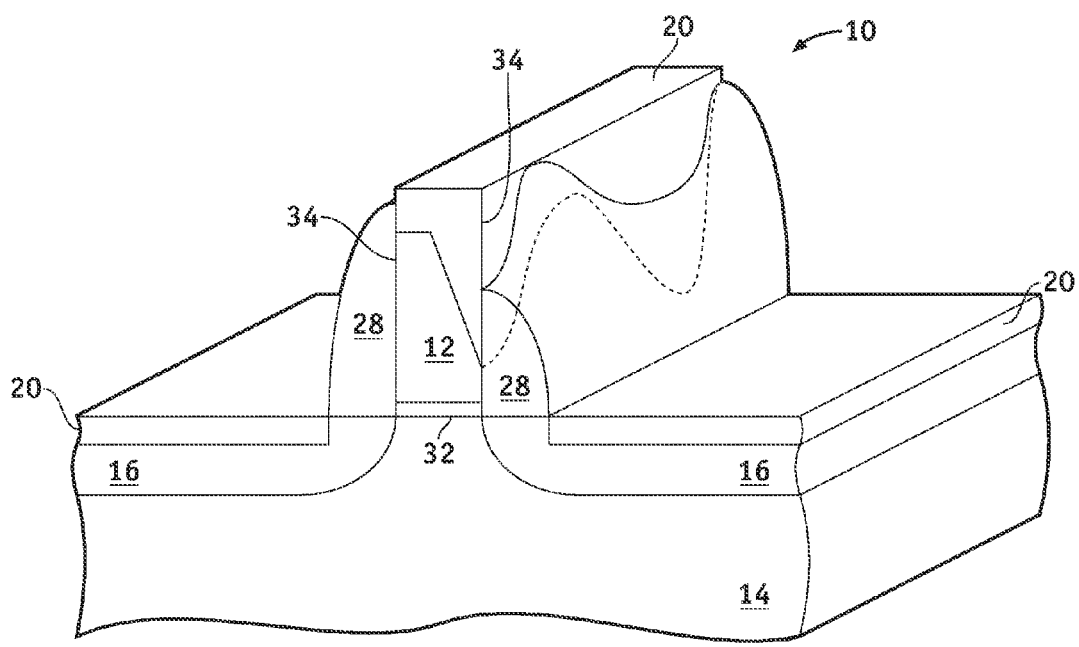
FIG. 2 is a cross-sectional view of a prior art field effect transistor with silicide roughness.

As described above, the height 78 of the gate insulator 54, the gate electrode 56 and the metal silicide 64 is less than the height 76 of the parallel sidewalls 72 of sidewall spacers 70. In contrast, referring momentarily to FIG. 1, the height of the gate insulator 32, the gate electrode 12, and the metal silicide 20 as measured from a surface of the silicon substrate, and indicated by double headed arrow 40, is not less than the height 42 of the sidewall spacers 28. As the thicknesses of the gate insulator and the metal silicide are substantially equal, respectively, in both cases, height of the gate electrode 56 of FIG. 3 is less, and preferably substantially less, than the height of the gate electrode 12 of FIG. 1. Accordingly, the parasitic capacitance created by device 50 of FIG. 3 is less, and preferably substantially less, than the parasitic capacitance created by device 10 of FIG. 1. However, as described in more detail below, the gate electrode 56 of FIG. 3 has a height large enough to prevent implantation of conductivity-determining ions into channel 58 during fabrication of the source and drain regions 60. In addition, the gate electrode 56 has a height large enough during fabrication of the sidewall spacers 70 such that the sidewall spacers are formed consistently wide enough to separate the gate electrode from the metal silicide 64 overlying the source and drain regions.

FIGS. 4-10 illustrate, in cross section, an MOS field effect transistor, such as field effect transistor 50, and methods for its fabrication in accordance with various embodiments of the invention. In this illustrative embodiment MOS device 50 is an N-channel MOS transistor, although similar method steps can be used to manufacture a P-channel MOS transistor with appropriate changes in dopant types. Likewise, similar method steps can used to manufacture complementary MOS transistors (CMOS). Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 4:
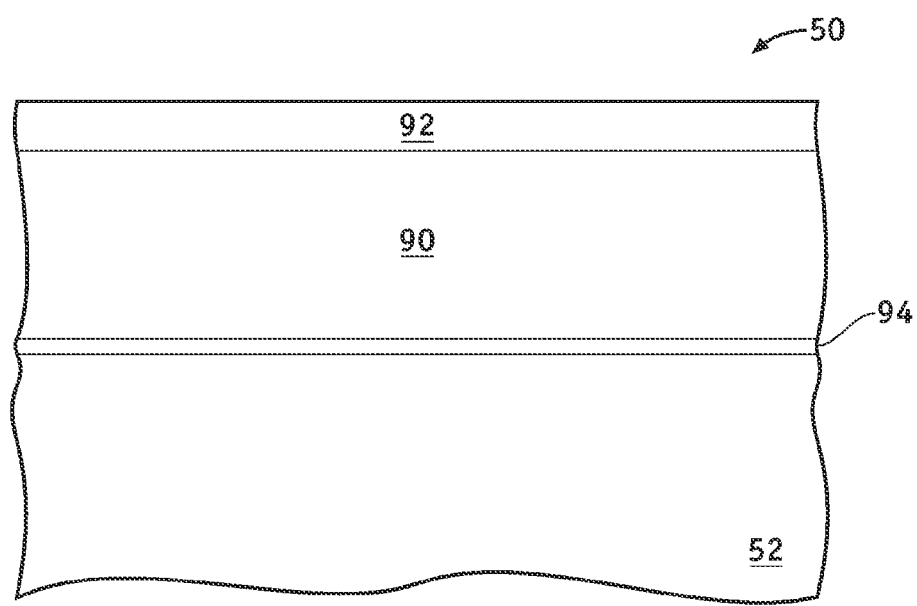
FIGS. 4-10 illustrate, in cross-section, a method for fabricating a field effect transistor in accordance with an exemplary embodiment of the present invention.

As illustrated in FIG. 4, the manufacture of an MOS transistor 50 in accordance with an embodiment of the invention begins with providing a semiconductor substrate 52. The semiconductor substrate is preferably a silicon substrate wherein the term "silicon substrate" is used herein to encompass the relatively pure silicon materials typically used in the semiconductor industry as well as silicon admixed with other elements such as germanium and the like. Silicon substrate 52 may be a bulk silicon wafer or a thin layer of silicon on an insulating layer (commonly know as a silicon-on-insulator wafer or SOI wafer) that, in turn, is supported by a silicon carrier wafer. A layer of gate insulator 94 is formed on the surface of silicon substrate 52. The gate insulator may be a thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). The gate insulator material is typically 1-10 nanometers (nm) in thickness. In accordance with one embodiment of the invention, a layer of polycrystalline silicon 90 is deposited overlying the layer of gate insulator. The layer of polycrystalline silicon is preferably deposited as undoped polycrystalline silicon and is subsequently impurity doped by ion implantation. The polycrystalline silicon can be deposited by LPCVD by the hydrogen reduction of silane. In an exemplary embodiment of the invention, the polycrystalline silicon layer 90 is deposited to a thickness so that it substantially prevents implantation of conductivity-determining ions into a channel region of the silicon substrate during fabrication of source and drain regions, discussed in more detail below. In another exemplary embodiment of the invention, the polycrystalline silicon layer is deposited to a thickness so that later-formed sidewall spacers are formed with a width that is well reproducible and suitable for separating the gate electrode from the source and drain regions, also discussed in more detail below. In a preferred embodiment of the invention, the polycrystalline silicon is deposited to a thickness in the range of about 60 to about 150 nm. A layer 92 of hard mask material such as silicon nitride, or silicon oxynitride can be deposited onto the surface of the polycrystalline silicon. The hard mask material can be deposited to a thickness of about 30 nm, also by LPCVD.

Figure 5:
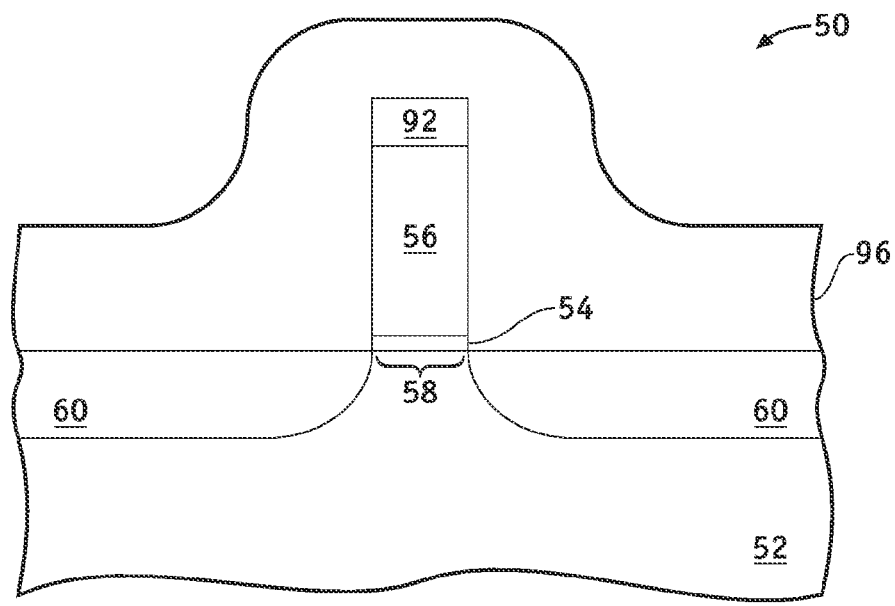

Hard mask layer 92 is photolithographically patterned and the underlying polycrystalline silicon layer 90 and gate insulator layer 94 is etched to form gate electrode 56 and gate insulator 54, as illustrated in FIG. 5. The polycrystalline silicon can be etched in the desired pattern by, for example, reactive ion etching (RIE) using a Cl⁻ or HBr/O$_2$ chemistry and the hard mask can be etched, for example, by RIE in a CHF$_3$, CF$_4$, or SF$_6$ chemistry.

Gate electrode 56 is used as an ion implantation mask to form source and drain extensions 60 in silicon substrate 52, as illustrated in FIG. 5. By using the gate electrode as an ion implant mask, the source and drain extensions and channel 58, defined as the substrate region between source and drain extensions 60, are all self aligned with the gate electrode. For an N-channel MOS transistor the source and drain extensions 60 are preferably formed by implanting arsenic ions, although phosphorus ions could also be used. Source and drain extensions 60 are shallow and preferably have a junction depth of less than about 20 nm and most preferably less than about 5-10 nm and are heavily impurity doped to provide sheet resistance of about 10 ohms per square. As used herein, the term "shallow" as applied to the source and drain extensions shall mean a region having such junction depths. The heavy impurity doping reduces the series resistance between contacts to be formed to the source and drain.

Figure 6:
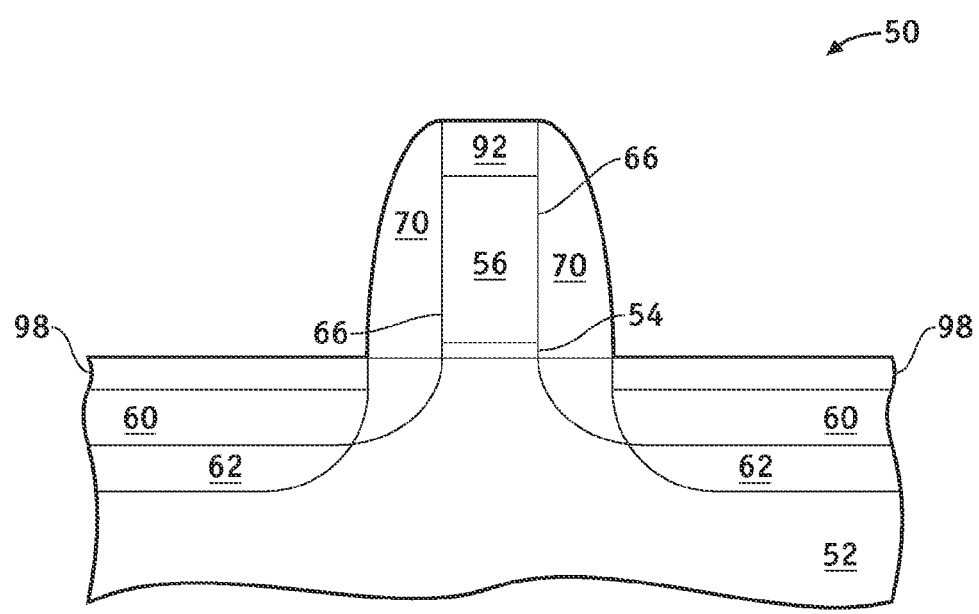

A layer 96 of spacer-forming material such as silicon oxide or silicon nitride is deposited over the source and drain extensions 60, the portion of hard mask layer 92 remaining on the top of the gate electrode, and about the gate electrode 56. The layer of spacer-forming material can be deposited, for example, to a thickness of about 50-500 nm by LPCVD. Layer 96 of spacer-forming material is anisotropically etched, for example by RIE using a CHF$_3$, CF$_4$, or SF$_6$ chemistry, to form sidewall spacers 70 on each sidewall of gate electrode 56, as illustrated in FIG. 6.

In an alternative embodiment of the invention, during formation of the gate electrode 56 by etching of the polycrystalline layer and hard mask, the gate insulator layer 94 can be left unetched. After formation of the sidewall spacers 70, which now will overlie the gate insulator layer 94, the gate insulator layer can be etched, using the sidewall spacers 70 as an etch mask, to form the gate insulator. Alternatively, the gate insulator layer can be etched after formation of deeper source and drain regions, discussed in more detail below.

Referring again to FIG. 6, gate electrode 56 and sidewall spacers 70 can be used as an ion implantation mask to form deeper source and drain regions 62 in silicon substrate 52. Device 50 then can be subjected to an anneal, such as rapid thermal anneal (RTA), to activate the impurities in the source and drain extensions 60 and regions 62. Regions 62 thus will be self aligned with spacers 70 and the gate electrode. For an NMOS transistor, regions 62 can be formed by ion implanting ions of arsenic or phosphorus. The deeper source and drain regions help to insure that later formed silicide regions will not extend through the doped source and drain extensions causing an electrical short to substrate 52. Although some integrated circuits fabrication processes may use additional spacers and additional implants into the source, drain, channel, or other regions, such additional process steps are not necessary to illustrate the invention and hence need not by shown. An oxide layer 98 is selectively thermally grown on the source and drain regions 62 of the silicon substrate 52. The hard mask 92 prevents the polycrystalline silicon gate electrode 56 from being oxidized during growth of thermal oxide 98.

Figure 7:
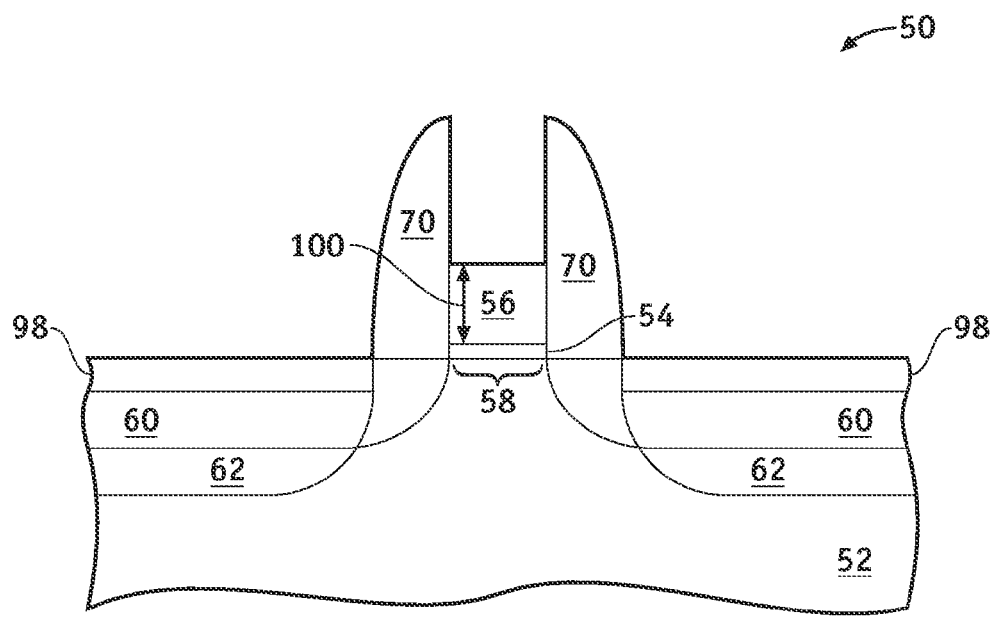

In accordance with an exemplary embodiment of the invention, the method of the present invention continues with the removal of the hard mask 92 from the gate electrode 56, as illustrated in FIG. 7. The hard mask is removed by an etch chemistry that is selective to silicon oxide so that oxide layer 98 is not substantially removed. The hard mask can be removed, for example, by hot phosphoric acid (H$_3$PO$_4$). The polycrystalline silicon gate electrode 56 is selectively etched to a height 100 that is sufficiently small so that the parasitic capacitance produced between the gate electrode and a subsequently-formed contact, to be discussed in more detail below, is reduced from the parasitic capacitance that would be produced if the gate electrode was not reduced in height. In turn, the polycrystalline silicon gate electrode 56 is etched to height 100 that is sufficiently large so that a metal silicide layer, discussed in more detail below, can be formed on the gate electrode and so that the gate electrode 56 insulates the metal silicide layer from the gate insulator 54. In a preferred embodiment of the invention, the gate electrode is etched to a height of about 10 to about 40 nm. In a more preferred embodiment of the invention, the gate electrode is etched to a height of about 20 to about 30 nm. The oxide layer 98 then is stripped from device 50. The oxide layer 98 can be removed, for example, by wet etch using diluted hydrofluoric acid.

Figure 8:
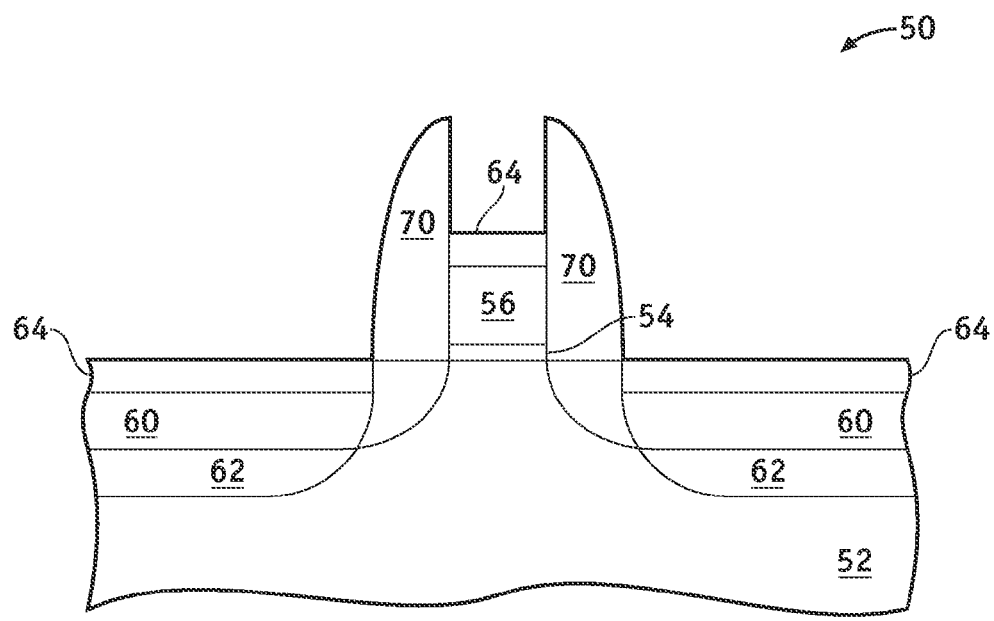
Figure 9:
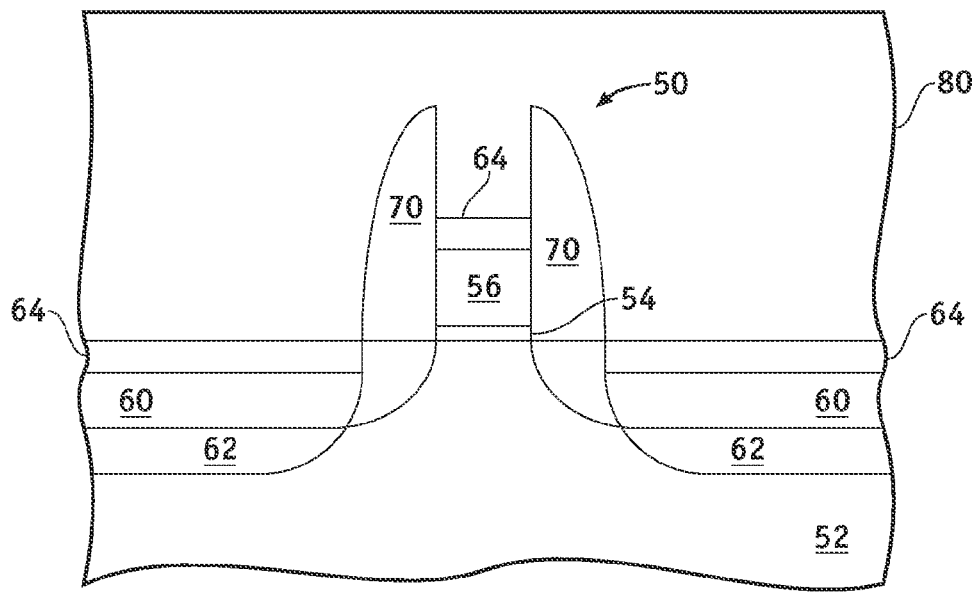
Figure 10:
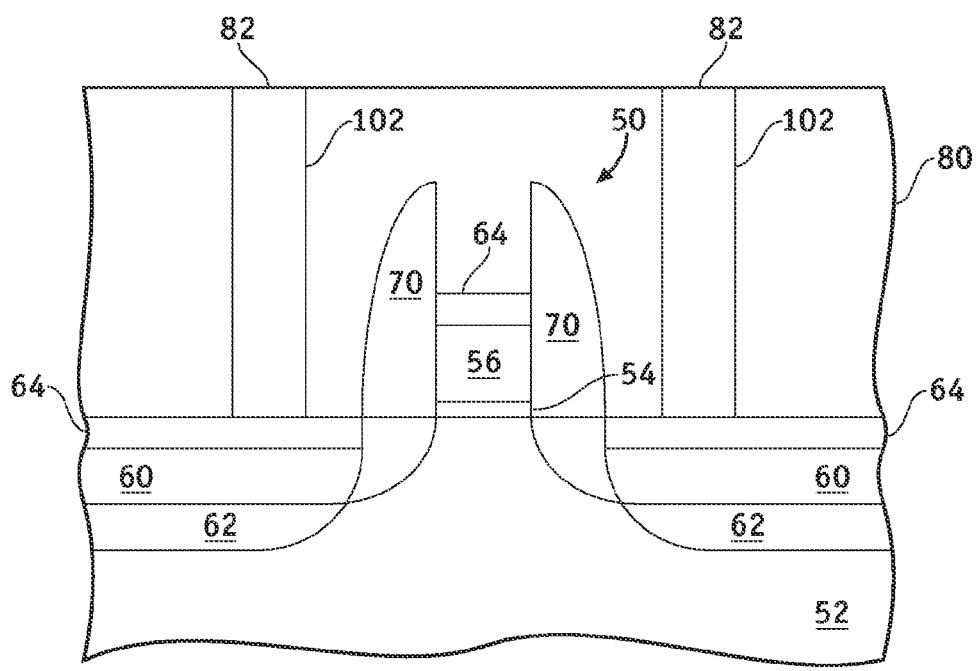

Referring to FIG. 8, a layer of silicide-forming metal is deposited onto the surface of the source and drain extensions and regions 60 and 62 and the surface of the gate electrode 56 and is heated, for example by RTA, to form a metal silicide layer 64 at the top of each of the source and drain regions as well as a metal silicide layer 64 on gate electrode 56. The silicide-forming metal can be, for example, cobalt, nickel, rhenium, ruthenium, or palladium, and preferably is either cobalt, nickel, or nickel alloy with other metals. The silicide-forming metal can be deposited, for example, by sputtering to a thickness of about 5-15 nm and preferably to a thickness of about 10 nm. Any silicide-forming metal that is not in contact with exposed silicon, for example the silicide forming metal that is deposited on the sidewall spacers, does not react during the RTA to form a silicide and may subsequently be removed by wet etching in a $H_2O_2/H_2SO_4$ or $HNO_3/HCl$ solution. The sidewall spacers restrict the formation of silicide layer 64 so that the metal silicide formed on the source and drain regions does not contact gate electrode 56, which would cause an electrical short between the gate electrode and the source and/or drain region. As illustrated in FIG. 9, a blanket layer of dielectric insulating material 80 is deposited over FET 50.

In accordance with an exemplary embodiment of the present invention, the method continues with photolithographically patterning and etching the ILD layer 80 to form contact openings 102 extending through ILD layer 80 and exposing a portion of silicide layers 64 on the source and drain regions. The insulating layer may be planarized by a chemical mechanical planarization (CMP) process before patterning. Metal contacts 82 are formed in contact openings 102 so that the source and drain regions can be appropriately connected electrically to other devices in the integrated circuit to implement the desired circuit function. Metal contacts 82 are typically formed of tungsten, although other metals can also be used.

Figure 11:
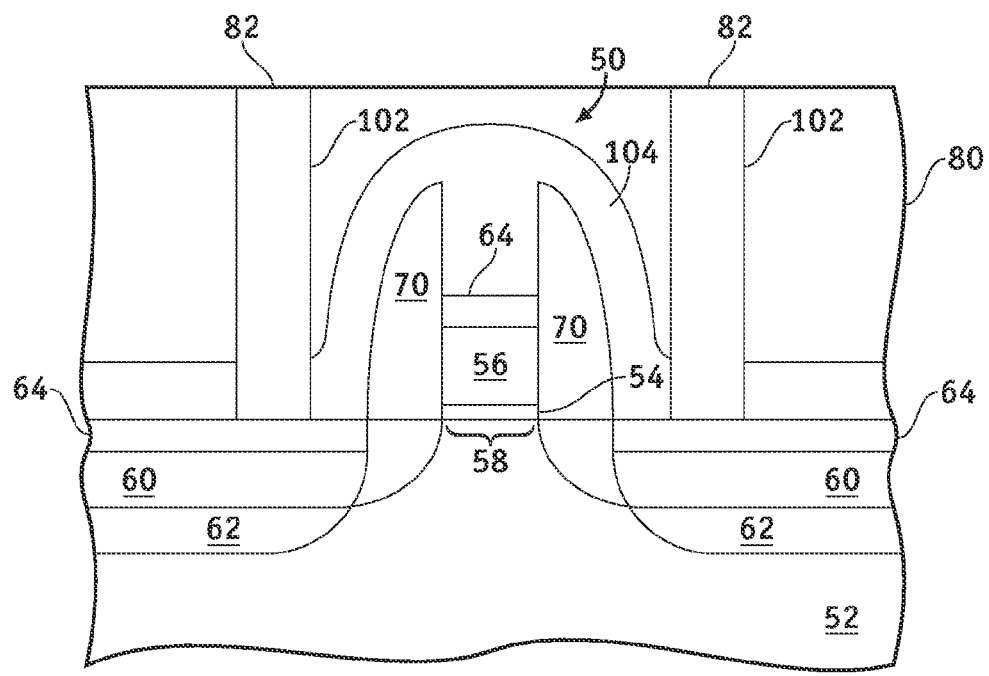
FIG. 11 is a cross-sectional view of a field effect transistor in accordance with another exemplary embodiment of the present invention.

In another exemplary embodiment of the invention, illustrated in FIG. 11, before deposition of the ILD layer 80, a highly intrinsically stressed film 104 may be formed overlying the field effect transistor. The highly intrinsically stressed film 104 produces stress in the channel 58 so that the carrier mobility in the channel is increased, which, in turn, increases the operation speed of device 50. For example, a tensile stressed silicon nitride layer can be deposited onto the FET by CVD deposition. This tensile stress increases electron mobility, thus increasing the operational speed of an NMOS FET. Conversely, a compressive stressed layer can be deposited onto the FET to increase hole mobility, thus increasing the operational speed of a PMOS FET. The highly intrinsically stressed film 104 may comprise any suitable insulating material, such as, for example, a silicon nitride, that has been deposited, treated, or otherwise fabricated to have an intrinsic stress that is greater than a stress that may result as a side effect of conventional oxidation, etch, deposition, or thermal steps. In other words, as used herein, the term "intrinsic stress" means that stress that is intentionally induced in film 104 to cause a stress to be transmitted to channel region 58. Highly intrinsically stressed films and methods for making such films are well known in the semiconductor industry and will not be discussed further herein.

FIGS. 12-17 illustrate, in cross section, an MOS field effect transistor 150 and methods for its fabrication in accordance with various embodiments of the invention. In this illustrative embodiment MOS device 50 is an N-channel MOS transistor, although similar method steps can be used to manufacture a P-channel MOS transistor with appropriate changes in dopant types. Likewise, similar method steps can used to manufacture complementary MOS transistors (CMOS).

Figure 12:
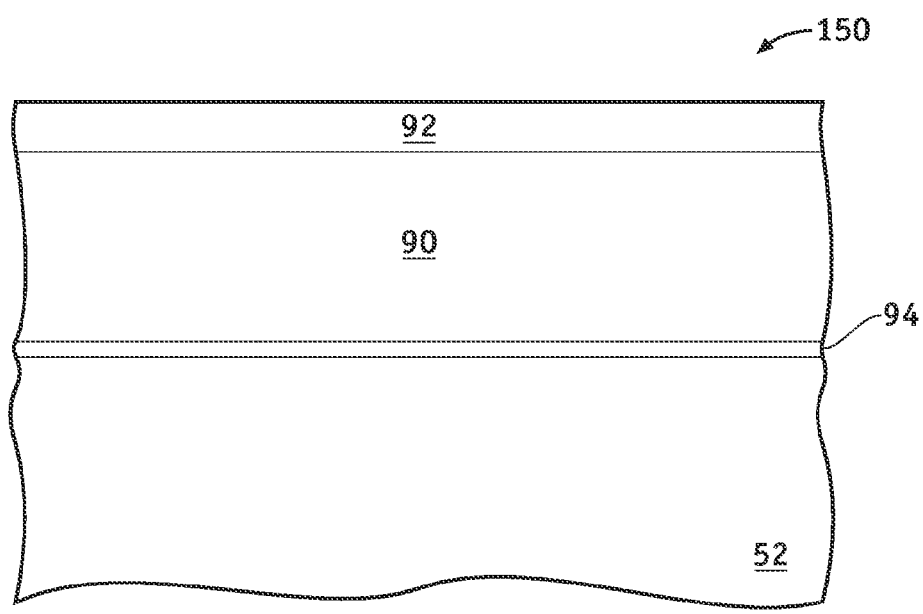
FIGS. 12-17 illustrate, in cross-section, a method for fabricating a field effect transistor in accordance with a further exemplary embodiment of the present invention.
Figure 13:
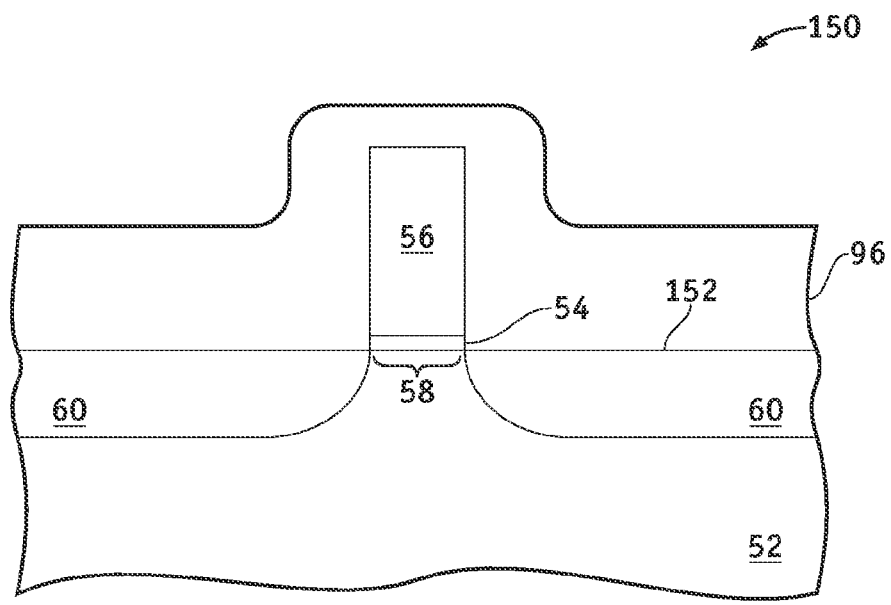

FIGS. 12-17 illustrate a method for fabricating a MOS field effect transistor 150 in accordance with another exemplary embodiment of the present invention. FET 150 is similar to FET 50 of FIGS. 4-10 and, accordingly, elements of FIGS. 12-17 that have the same reference numbers as elements of FIGS. 4-10 are the same elements of FIGS. 4-10 and may be formed of any of the same materials and by any of the same methods as described above with reference to FIGS. 4-10. The method described with reference to FIGS. 12-17 begins as illustrated in FIG. 12, by utilizing the steps described above with reference to FIG. 4, which, for brevity, will not be described again. Accordingly, after performing the steps illustrated in FIG. 4, the polycrystalline silicon layer 90 and the gate insulator layer 96 are etched to form gate electrode 56 and gate insulator 54, as illustrated in FIG. 13. Patterned hard mask 92 then can be removed from gate electrode 56.

Gate electrode 56 is used as an ion implantation mask to form source and drain extensions 60 at a surface 152 of silicon substrate 52. Again, by using the gate electrode as an ion implant mask, the source and drain extensions 60 and channel 58, defined as the substrate region between source and drain extensions 60, are all self aligned with the gate electrode. A layer 96 of spacer-forming material such as silicon oxide or silicon nitride is deposited over the source and drain extensions 60 and the gate electrode 56.

Figure 14:
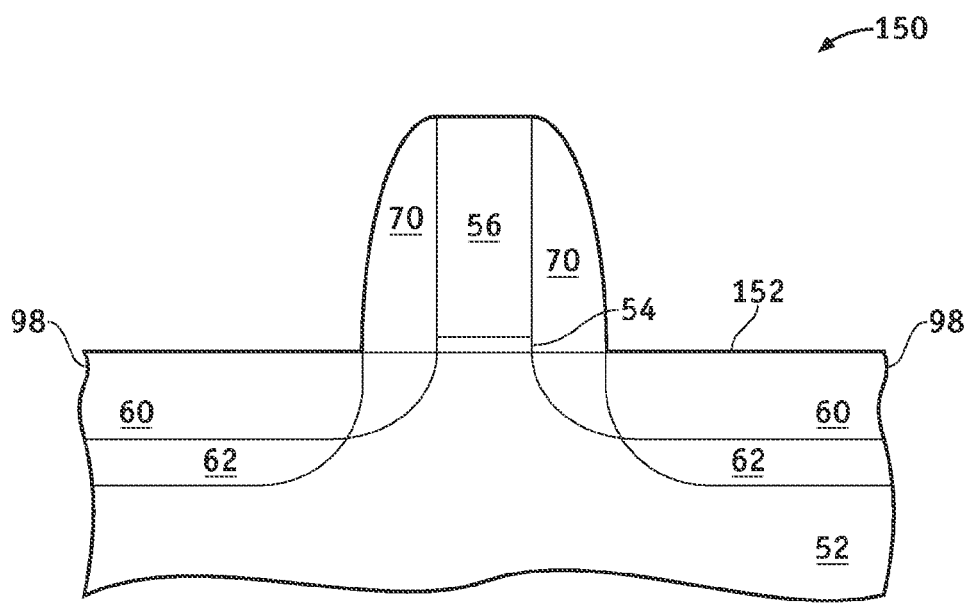

Layer 96 of spacer-forming material is anisotropically etched, for example by RIE using a $CHF_3$, $CF_4$, or $SF_6$ chemistry, to form sidewall spacers 70 on each sidewall of gate electrode 56, as illustrated in FIG. 14. Gate electrode 56 and sidewall spacers 70 can be used as an ion implantation mask to form deeper source and drain regions 62 in silicon substrate 52. Device 150 then can be subjected to an anneal, such as RTA, to activate impurities in the source and drain extensions 60 and regions 62. Regions 62 thus will be self aligned with spacers 70 and the gate electrode. For an NMOS transistor, regions 62 can be formed by ion implanting ions of arsenic or phosphorus.

In an alternative embodiment of the invention, during formation of the gate electrode 56 by etching of the polycrystalline layer, the gate insulator layer 94 can be left unetched. After formation of the sidewall spacers 70, which now will overlie the gate insulator layer 94, the gate insulator layer can be etched, using the sidewall spacers 70 as an etch mask, to form the gate insulator. Alternatively, the gate insulator layer can be etched after formation of deeper source and drain regions 62.

Figure 15:
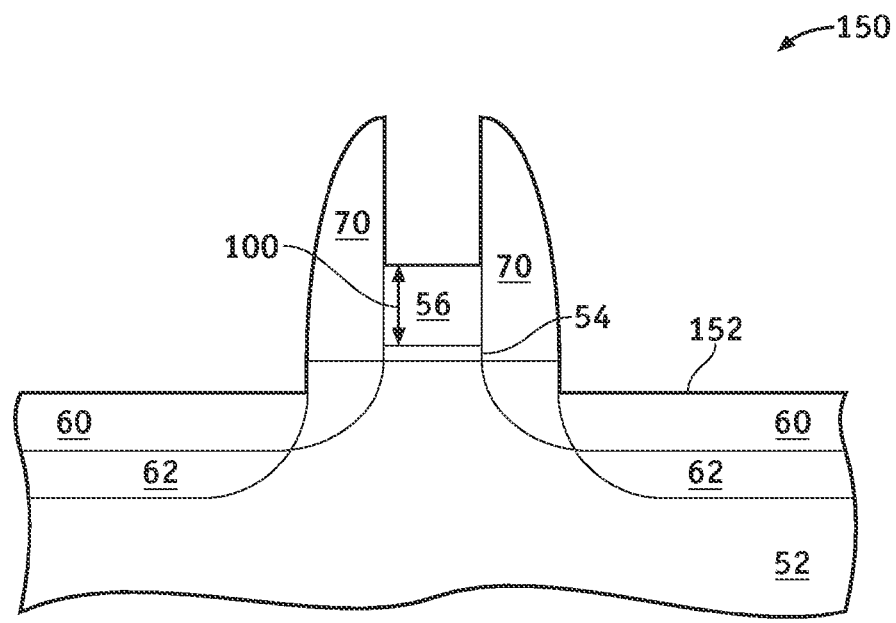

Referring to FIG. 15, the polycrystalline silicon gate electrode 56 then is selectively etched to a height 100 that is sufficiently small so that the parasitic capacitance produced between the gate electrode and a subsequently formed contact is reduced from the parasitic capacitance that would be produced if the gate electrode was not reduced in height. In turn, the polycrystalline silicon gate electrode 56 is etched to height 100 that is sufficiently large so that a subsequently-formed metal silicide layer can be formed on the gate electrode and so that the gate electrode 56 insulates the metal silicide layer from the gate insulator 54. In a preferred embodiment of the invention, the gate electrode is etched to a height of about 10 to about 40 nm. In a more preferred embodiment of the invention, the gate electrode is etched to a height of about 20 to about 30 nm. During etching of the polycrystalline silicon gate electrode 56, the exposed surface 152 of silicon substrate 52 also is etched.

Figure 16:
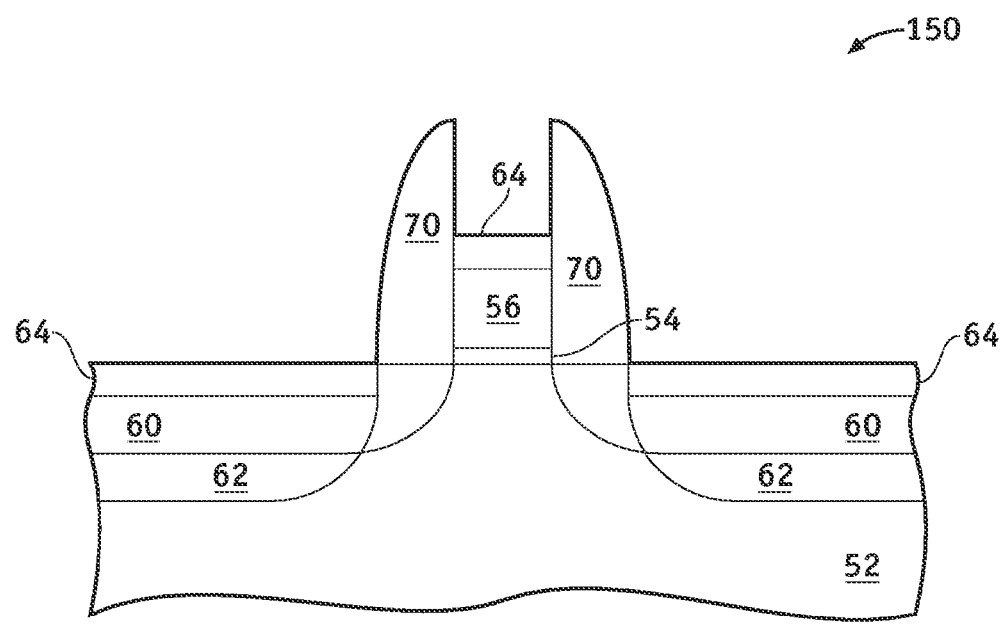

Referring to FIG. 16, a layer of silicide-forming metal is deposited onto the surface of the source and drain extensions and regions 60 and 62 and the surface of the gate electrode 56 and is heated, for example by RTA, to form a metal silicide layer 64 at the top of each of the source and drain regions as well as a metal silicide layer 64 on gate electrode 56.

Figure 17:
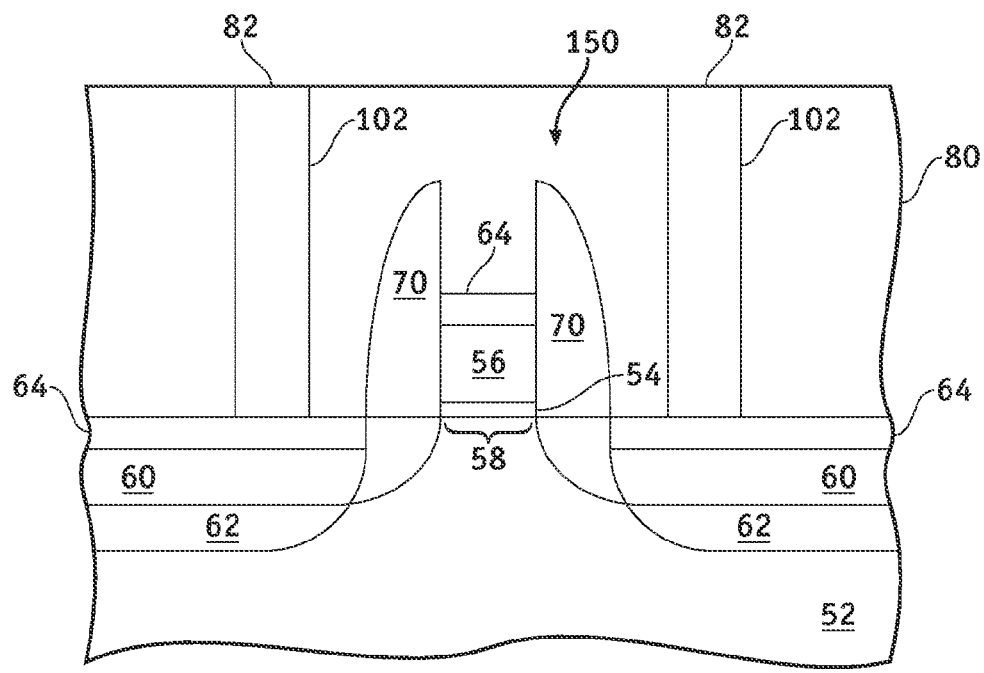

A layer 80 of ILD is deposited and subsequently photolithographically patterned and etched to form contact openings 102 extending through the insulating material and exposing a portion of silicide layers 64 on the source and drain regions, as illustrated in FIG. 17. The insulating layer may be planarized by a chemical mechanical planarization (CMP) process before patterning. Metal contacts 82 are formed in contact openings 102 so that the source and drain regions can be appropriately connected electrically to other devices in the integrated circuit to implement the desired circuit function.

Figure 18:
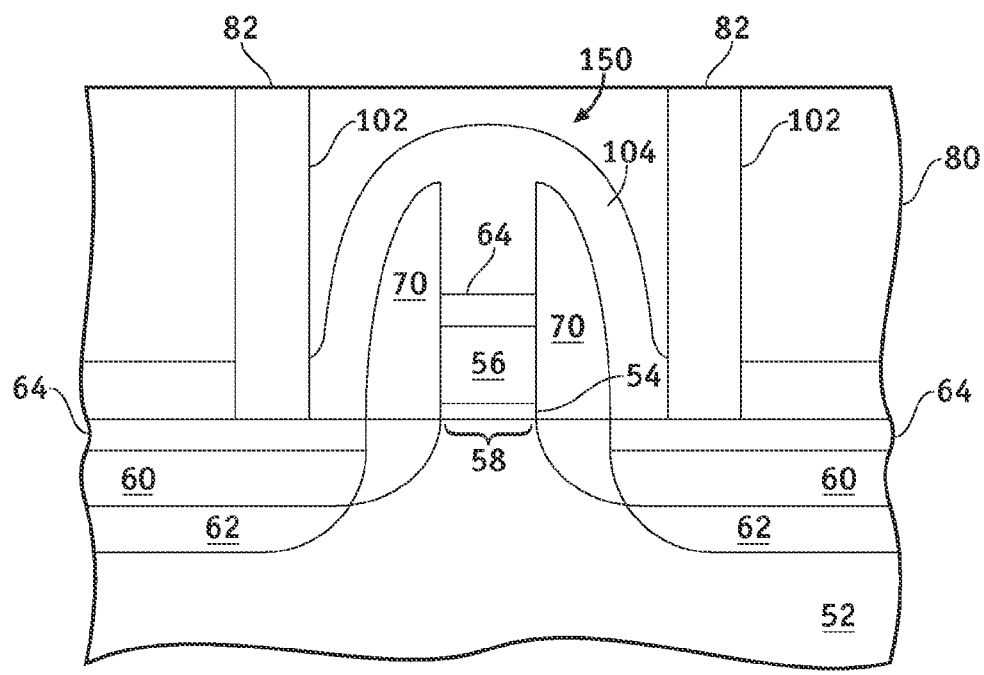
FIG. 18 is a cross-sectional view of a field effect transistor in accordance with another exemplary embodiment of the present invention.

In another exemplary embodiment of the invention, illustrated in FIG. 18, before deposition of the ILD layer 80, a highly stressed film 104 may be formed overlying the field effect transistor. The recess of the source and drain regions 62 below the initial surface 152 of silicon substrate provides more efficient stress transfer from the highly stressed film 104 into the FET channel 58. Therefore, the carrier mobility in the channel 58 and, in turn, the operational speed of device 150 is increased even further.

Accordingly, field effect transistors with reduced parasitic capacitance and methods for fabricating such field effect transistors have been presented. The FETs and the methods for producing them involve the etching of the FET gate electrodes after formation of the sidewall spacers and the source and drain regions. In this manner, the channel region of the substrate is protected from ion implantation during formation of the source and drain regions. In addition, sidewall spacers with suitable widths for separating the gate electrode from the metal silicide on the source and drain regions can be formed. The gate electrode is etched after formation of the sidewall spacers and the source and drain regions to reduce parasitic capacitance in the device and silicide roughness on the gate structures. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a field effect transistor, the method comprising the steps of:
    forming a gate insulator overlying a silicon substrate;
    forming a polycrystalline silicon gate electrode in physical contact with the gate insulator, wherein the gate electrode has two parallel sidewalls;
    fabricating two sidewall spacers overlying the silicon substrate after the step of forming the polycrystalline silicon gate electrode, wherein each of the two sidewall spacers has a sidewall that is adjacent to one of the two parallel sidewalls of the gate electrode;
    removing a first portion of the gate electrode between the two sidewall spacers such that a second portion of the gate electrode remains between the two sidewall spacers; and
    forming metal silicide using the second portion of the gate electrode to form the metal silicide, the step of forming metal silicide performed after the step of removing a first portion of the gate electrode.

2. The method of claim 1, further comprising the step of implanting conductivity-determining ions into the silicon substrate to form source and drain extensions, wherein the step of implanting is performed after the step of forming a polycrystalline silicon gate electrode and before the step of fabricating two sidewall spacers.

3. The method of claim 2, further comprising the step of implanting conductivity-determining ions into the silicon substrate to form source and drain regions, wherein the step of implanting to form source and drain regions is performed after the step of fabricating two sidewall spacers and before the step of first removing a portion of the gate electrode.

4. The method of claim 1, wherein the steps of removing a first portion of the gate electrode and forming metal silicide comprise removing a first portion of the gate electrode and forming metal silicide so that, after the formation of the metal silicide, the second portion of the gate electrode and the metal silicide together have a height, as measured from a surface of the silicon substrate, that is less than a height of the sidewalls of the two sidewall spacers, as measured from the surface of the silicon substrate.

5. The method of claim 1, further comprising the step of forming an oxide on a surface of the silicon substrate after the step of fabricating two sidewall spacers and before the step of removing a first portion of the gate electrode.

6. The method of claim 5, further comprising the step of forming an intrinsically stressed film overlying the gate electrode, the sidewall spacers and the silicon substrate, wherein the step of forming an intrinsically stressed film is performed after the steps of removing a first portion of the gate electrode and forming metal silicide.

7. The method of claim 1, further comprising the step of forming an intrinsically stressed film overlying the gate electrode, the sidewall spacers and the silicon substrate, wherein the step of forming an intrinsically stressed film is performed after the steps of removing a first portion of the gate electrode and forming metal silicide.

8. The method of claim 1, wherein the step of removing a first portion of the gate electrode comprises the step of removing the first portion of the gate electrode so that the second portion of the gate electrode has a height in the range of about 10 to about 40 nm.

9. The method of claim 8, wherein the step of removing a first portion of the gate electrode comprises the step of removing the first portion of the gate electrode so that the second portion of the gate electrode has a height in the range of about 20 to about 30 nm.

10. A method for fabricating a field effect transistor, the method comprising the steps of:
    depositing and patterning a layer of polycrystalline silicon overlying a silicon substrate to form a gate electrode, the gate electrode having sidewalls and defining a channel in the silicon substrate underlying the gate electrode;
    implanting first ions of a conductivity-determining impurity into the silicon substrate using the gate electrode as an implantation mask to form spaced-apart impurity-doped extensions;
    depositing a layer of spacer-forming material overlying the gate electrode;

anisotropically etching the layer of spacer-forming material to form sidewall spacers disposed adjacent to the sidewalls of the gate electrode;

implanting second ions of a conductivity-determining impurity into the silicon substrate using the gate electrode and the sidewall spacers as an implantation mask to form spaced-apart impurity-doped regions;

removing a first portion of the gate electrode from between the sidewall spacers such that a second portion of the gate electrode remains between the sidewall spacers; and forming metal silicide using the second portion of the gate electrode and the spaced-apart impurity doped regions to form the metal silicide.

11. The method of claim 10, wherein the step of removing a first portion of the gate electrode comprises the step of removing the first portion of the gate electrode so that the remaining second portion of the gate electrode and the metal silicide has a height, as measured from the silicon substrate, that is less than a height of the sidewall spacers, as measured from the silicon substrate.

12. The method of claim 10, wherein the step of removing a first portion of the gate electrode comprises the step of removing the first portion of the gate electrode so that the remaining second portion of the gate electrode has a height in the range of about 10 to about 40 nm.

13. The method of claim 12, wherein the step of removing a first portion of the gate electrode comprises the step of removing the first portion of the gate electrode so that the remaining second portion of the gate electrode has a height in the range of about 20 to about 30 nm.

14. The method of claim 10, further comprising the steps of:
forming an oxide on the silicon substrate after the step of implanting second ions and before the step of removing a first portion of the gate electrode; and
removing the oxide from the silicon substrate after the step of removing a first portion of the gate electrode and before the step of forming metal silicide.

15. The method of claim 14, further comprising the step of forming an intrinsically stressed film on the metal silicide of the source and drain regions, the sidewall spacers, and the metal silicide on the gate electrode to induce a stress in the channel.

16. The method of claim 10, further comprising the step of forming an intrinsically stressed film on the metal silicide of the source and drain regions, the sidewall spacers, and the metal silicide on the gate electrode to induce a stress in the channel.

17. The method of claim 10, further comprising the steps of:
depositing a blanket insulating layer overlying the metal silicide on the gate electrode, the metal silicide on the spaced-apart impurity doped regions, and the sidewall spacers; and
forming contacts that extend through the blanket insulating layer to the metal silicide on the spaced-apart impurity doped regions.

* * * * *